United States Patent [19]

Gordon et al.

[11] Patent Number: 5,178,911
[45] Date of Patent: Jan. 12, 1993

[54] PROCESS FOR CHEMICAL VAPOR DEPOSITION OF MAIN GROUP METAL NITRIDES

[75] Inventors: Roy G. Gordon, Cambridge, Mass.; David Hoffman, Spring, Tex.; Umar Riaz, Cambridge, Mass.

[73] Assignee: The President and Fellows of Harvard College, Cambridge, Mass.

[21] Appl. No.: 790,576

[22] Filed: Nov. 8, 1991

Related U.S. Application Data

[63] Continuation-in-part of Ser. No. 444,112, Nov. 30, 1989.

[51] Int. Cl.[5] .............................................. C23C 16/00
[52] U.S. Cl. ............................. 427/255.2; 427/255.1; 427/248.1; 427/314; 427/126.1; 427/255
[58] Field of Search ................... 427/255.2, 255.1, 255, 427/314, 248.1, 126.1

[56] References Cited

U.S. PATENT DOCUMENTS

| | | |
|---|---|---|
| 4,196,233 | 4/1980 | Bitzer et al. |
| 4,414,015 | 11/0883 | Van Laethum et al. |
| 4,714,625 | 12/1987 | Chopra et al. ......................... 427/35 |
| 4,792,467 | 12/1988 | Melas et al. ....................... 427/248.1 |
| 4,832,986 | 5/1989 | Gladfelter et al. ................ 427/248.1 |
| 4,869,925 | 9/1989 | Hiai et al. ............................... 427/96 |

FOREIGN PATENT DOCUMENTS 0464515 1/1992 European Pat. Off. .

OTHER PUBLICATIONS

Roy G. Gordon et al., "Silicon Dimethyl Complexes and Ammonia as Precursors for the Atmospheric Pressure Chemical Vapor Deposition of Silicon Nitride Thin Films" *Chem. Mat.* 2(5), 480 (Sep.-Oct., 1990).

Roy G. Gordon et al., "Atmospheric Pressure Chemical Vapor Deposition of Gallium Nitride Thin Films" Mat. Res. Soc. Symp. vol. 204, Materials Research Society, Pittsburgh, Pa.; pp. 95–99 (1991).

Roy G. Gordon et al., "Atmospheric Pressure Chemical Vapor Deposition of Aluminum Nitride Thin Films at 200°–250° C." *J. Mater. Res.* 6(1), 5–7 (Jan, 1991).

Anonymous "Ammonolysis of Tetrakisdimethylaminosilane for Low Pressure Chemical Vapor Deposition of Silicon Nitride" *Res. Disclosure* 314, 494 (Jun., 1990).

*Primary Examiner*—Shrive Beck
*Assistant Examiner*—Roy V. King
*Attorney, Agent, or Firm*—Choate, Hall & Stewart

[57] ABSTRACT

A process for depositing a thin film of a main group metal nitride, e.g., AlN, GaN or $Sn_3N_4$, is provided. The vapors of a main group metal amido compound are mixed with ammonia gas and allowed to react near a substrate heated to a temperature in the range of 100° C. to 400° C. resulting in deposition of a film on the substrate.

19 Claims, 3 Drawing Sheets

PROCESS FOR CHEMICAL VAPOR DEPOSITION OF MAIN GROUP METAL NITRIDES

The U.S. Government has rights to this invention based upon funding by the National Science Foundation Grant Number DMR-8802306.

BACKGROUND OF THE INVENTION

This patent application is a continuation-in-part application of co-pending U.S. patent application Ser. No. 444,112 filed Nov. 30, 1989 for "Process for Chemical Vapor Deposition of Transition Metal Nitrides".

The present invention relates to transition metal and main group metal nitride films.

Transition metal nitrides, for example, titanium nitride, are extremely hard, chemically inert and electrically conductive, have high melting points, and are reflective. This unique combination of properties makes them useful in numerous applications including wear-resistant, corrosion-resistant, decorative, electronically conductive or optically reflective coatings.

The unique combination of chemical inertness and toughness of nitrides of main group metals such as aluminum, gallium, tin and indium makes them well suited to a variety of applications. Aluminum nitride is an insulating material used as a passivating layer on reactive materials because of its oxygen gettering capability. Tin nitride is electrically conductive and transparent. It has potential applications as a conductive layer on plastics and as an electrically conductive diffusion barrier in solar cells. Gallium nitride is a wide band gap semiconductor used in blue light-emitting diodes.

SUMMARY OF THE INVENTION

According to an aspect of the invention, a transition metal nitride coating is produced by forming a vaporous mixture of ammonia gas and a transition metal organometallic vapor and exposing the vaporous mixture to a heated substrate resulting in a deposition of a transition metal nitride coating on the substrate.

According to another aspect of the invention, a transition metal nitride coating is produced by forming a vaporous mixture of ammonia gas and a transition metal amido compound and exposing the vaporous mixture to a heated substrate resulting in deposition of a transition metal nitride coating on the substrate.

In preferred embodiments, the transition metal organometallic vapor may be a titanium, zirconium, hafnium, or vanadium metal organometallic compound. In other preferred embodiments, the transition metal organometallic vapor or amido compound contains a dialkylamido functional group or a cyclic amido functional group. In other embodiments, the cyclic amido group can be a piperidino or a pyrrolidino group. In other embodiments, a dialkylamido functional group can be replaced by an alkyl functional group such as a tertiary butyl group.

In other preferred embodiments, the ammonia and transition metal organometallic or amido vapor are individually diluted by an inert carrier gas such as helium, argon, or neon before they are combined in close proximity to the substrate surface. For a chemical vapor deposition reactor having a 1 cm×4 cm cross-section and a flow rate of 2-3 liters/min, vapor reactants can be combined between 1.0 and 10.0 cm, more preferably between 1.5 and 3.0 cm and most preferably between 2.0 and 2.5 cm from the substrate surface.

In another aspect of the present invention, a main group metal nitride coating is produced by forming a vaporous mixture of ammonia gas and a main group metal amido compound and exposing the vaporous mixture to a heated substrate resulting in deposition of a main group metal nitride coating on the substrate. The main group metal and its amido compound contain an element selected from the group containing Al, Ga, Sn and In.

In preferred embodiments, the amido compound contains a dialkylamido functional group or a cyclic amido functional group. The alkyl group is preferably an ethyl or methyl group. In other embodiments, the cyclic amido group can be a piperidino or a pyrrolidino group. A dialkylamido functional group can be replaced by an alkyl group as long as at least one dialkylamido group remains.

In other preferred embodiments, the ammonia and main group metal amido vapor are individually diluted by an inert carrier gas such as helium, argon, nitrogen or neon before they are combined in close proximity to the substrate surface.

In preferred embodiments the substrate is heated to a temperature in the range 100° C. to 400° C., more preferably 150° C. to 300° C. and most preferably 200° C. to 250° C.

The process of the invention allows deposition of transition metal nitride films and main group metal nitride films at lower substrate temperatures than those utilized in previous chemical vapor deposition (CVD) methods, without production of corrosive by-products which attack the substrate and reactor apparatus. The metal nitride coatings can be deposited on substrates not available to conventional CVD processes because of the low deposition temperature used in the claimed process. Transition metal nitride and main group metal nitride films deposited using the process exhibit higher purity than those made according to earlier chemical vapor deposition methods and are smooth, continuous, fine-grained, and pinhole-free. Such high-quality films are suitable for protection of substrates against corrosion, interdiffusion, or abrasion, and for making contacts to solar cells or computer microcircuits. Furthermore, the process can be performed using simple and inexpensive equipment operated at atmospheric pressure obviating expensive and complex vacuum and electrical equipment. The process can also be operated at reduced pressure.

The films produced according to the process provide low-resistance electrical contact to crystalline or amorphous silicon substrates. The films also provide excellent barriers against diffusion or reaction between metals and silicon. A variety of substrates can be used provided that they do not melt or decompose under the reaction conditions of the deposition.

DESCRIPTION OF THE PREFERRED EMBODIMENTS

Figure 1:
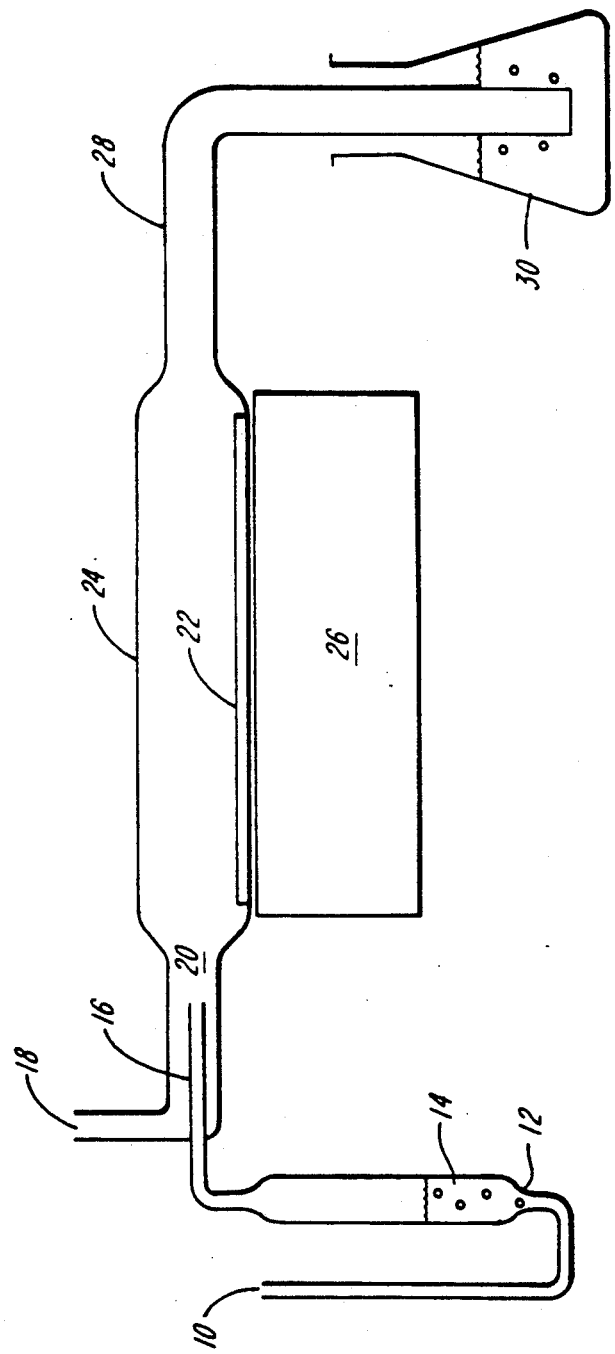
FIG. 1 is a schematic representation of a chemical vapor deposition apparatus.

The process of the invention is accomplished using a chemical vapor deposition apparatus such as that shown in FIG. 1. Similar apparatuses are commercially available from Applied Materials, Santa Clara, CA and Watkins Johnson, Scotts Valley, CA. Helium carrier gas from a supply (not shown) enters at inlet 10 and passes through bubbler 12 where it entrains vapor of transition metal containing compound 14 and carries the vapor into delivery tube 16. Ammonia vapor, $NH_3$, diluted in helium, enters from a supply (not shown) at inlet 18 and mixes with transition metal-containing compound vapor in mixing region 20. Mixed vapors pass over substrate 22 inside rectangular reactor tube 24 which is heated by hot plate 26. Spent vapors exit through tube 28 into oil bubbler 30, which prevents ambient atmosphere from penetrating into the interior of reactor tube 24.

Preferred metal-containing compounds are tetrakis(dialkylamido)titanium(IV) compounds, having the general formula $Ti(NR_2)_4$, where R is an organic radical such as methyl, ethyl, or propyl. These include derivatives of cyclic amines of general formula $Ti(NR')_4$ where NR' is a cyclic amido group, e.g. tetrakis(piperidino)titanium. The methyl derivative, tetrakis(dimethylamido)titanium is most preferred, because it is the most volatile.

Other suitable metal containing reactants include alkyl substituted derivatives of the dialkylamide mentioned above such as tert-butyl tris(dimethylamido)titanium, $Ti[N(CH_3)_2]_3[C(CH_3)_3]$.

Substrate temperatures are typically in the range of 100° C. to 400° C., preferably in the range 150° C. to 300° C., and most preferably 200° C. to 250° C. At temperatures below 100° C., deposition rates become low, adhesion to the substrates may be poor, and oxygen contamination from traces of water vapor becomes hard to avoid. At temperatures above about 200° C., carbon contamination of the titanium nitride films increases. Oxygen or carbon impurities in the films tend to increase their electrical resistivity and decrease their hardness.

EXAMPLE 1

A rectangular (1 cm×4 cm×50 cm) reaction chamber formed of quartz glass, containing silicon, steel, vitreous carbon or glass substrates was heated on its underside to about 200° C. Pure helium gas (containing less than 0.1 ppm water and 0.2 ppm oxygen) was flowed through the chamber in order to displace oxygen and water vapor. Then helium was passed at a rate of about 1 liter/min through a bubbler of liquid tetrakis(dimethylamido)titanium(IV), $Ti[N(CH_3)_2]_4$, held at a temperature of 60° C. This gas mixture passed through a 1 mm i.d. delivery line to the reaction chamber. About 2 cm before this line entered the reaction chamber, this gas mixture was combined with 10% (by volume) of ammonia gas diluted with helium at a rate of about 1 liter/min. The combined gas mixtures flowed together over the glass substrate and out of the reaction chamber to an oil bubbler which prevented backflow of air into the reaction chamber. After a reaction time of 1 minute, the substrate was cooled in pure helium.

Figure 2:
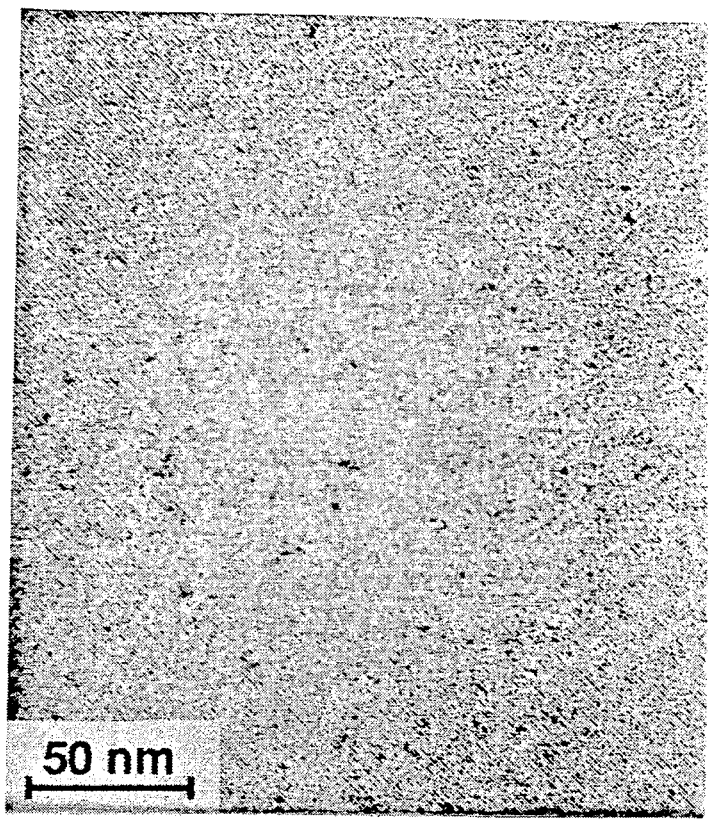
FIG. 2 is a transmission electron micrograph of a titanium nitride thin film deposited at 200° C. on a carbon film.
Figure 3:
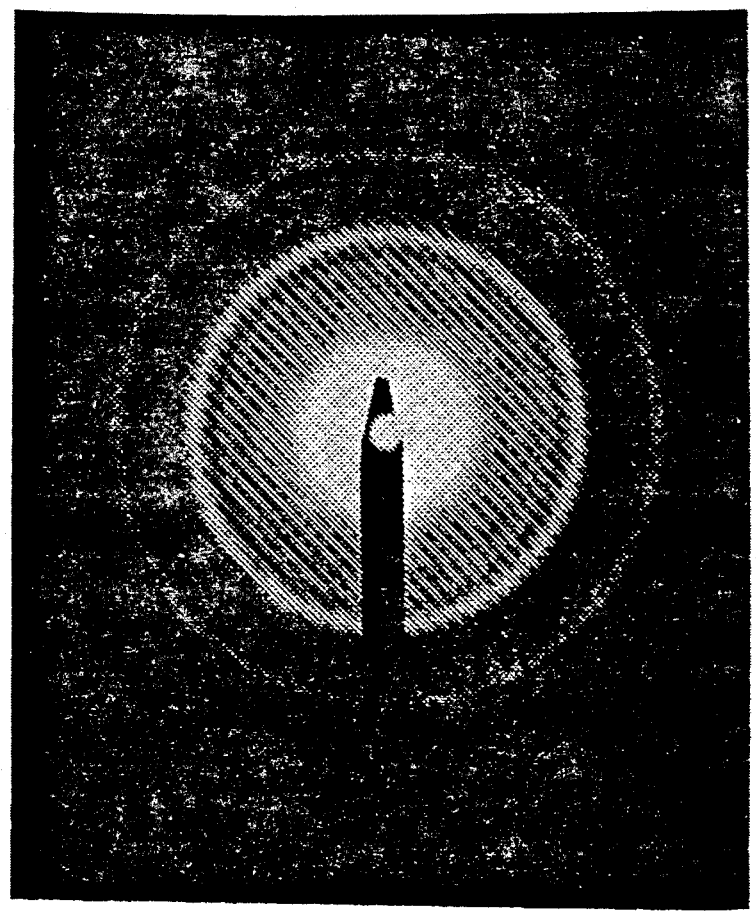
FIG. 3 is a transmission electron microscope electron diffraction pattern for a titanium nitride thin film deposited at 200° C. on a carbon film.

Analysis of the deposited film by X-ray photoelectron spectroscopy (XPS), showed that it consisted of titanium nitride with less than 1% carbon and oxygen impurities. The film was about 100 nanometers thick and had a mirror-like dark golden surface. A typical film is shown in the transmission electron micrograph of FIG. 2. Electron diffraction showed that the film was composed of polycrystalline titanium nitride as indicated by the typical electron diffraction pattern shown in FIG. 3. Rutherford backscattering analysis determined that there was a slight excess of nitrogen in the film.

The quality of the deposited titanium nitride as a diffusion barrier was tested by depositing titanium nitride on a single-crystal silicon substrate by the process of Example 1. Then a thin layer of gold was sputtered on the titanium nitride. Annealing this structure for 10 minutes at 400° C. produced no diffusion of gold into the silicon, according to Rutherford backscattering measurements on the annealed sample.

These results show that titanium nitride films prepared according to the process have good qualities as diffusion barriers and are reasonably free of voids, cracks, pinholes or other defects.

EXAMPLE 2

The procedure of Example 1 was repeated with tetrakis (diethylamido)titanium in the bubbler heated to 90° C. Similar results were obtained.

EXAMPLE 3

The procedure of Example 1 was repeated with tert-butyl tris(dimethylamido)titanium, $Ti(t-Bu)(N(Me)_2)_3$, in the bubbler heated to 60° C. Similar results were obtained.

EXAMPLE 4

The procedure of Example 1 was repeated, except that the ammonia gas reactant was omitted. No deposit was formed.

EXAMPLE 5

The procedure of Example 1 was repeated, except that the substrate was heated to 400° C. The deposited film was contaminated with about 8 atomic percent carbon.

EXAMPLE 6

The procedure of Example 1 was repeated, except that polyester plastic sheets were used as substrates and held at a temperature of 150° C. A titanium nitride film of similar quality was deposited.

EXAMPLE 7

Gallium nitride was prepared according to the following equation, $$Ga_2(NMe_2)_6 + 2NH_3 \rightarrow 2GaN + 6HNMe_2. \quad (1)$$

Deposition was carried out on silicon, vitreous carbon and glass substrates at substrate temperatures of 200° C. in an atmospheric-pressure laminar-flow rectangular glass reactor heated from below. Temperatures of 100° C. to 400° C. are useful. Ultra-high purity helium (containing less than 0.5 ppb $O_2$ and $H_2O$) was used as a carrier gas for the gallium-containing precursor, $Ga_2(NMe_2)_6$, and as a diluent for ammonia. The CVD system, loaded with the substrates, was purged for at least 2 hours before each deposition to remove trace levels of $O_2$ and $H_2O$. During the depositions, helium was passed through a stainless steel bubbler containing the gallium precursor, $Ga_2(NMe_2)_6$, and this mixture then flowed through a 1 mm i.d. delivery line to the reaction chamber. Approximately 1 cm before this delivery line entered the reaction chamber, the $Ga_2(NMe_2)_6$/He mixture was combined with ammonia gas diluted with helium ($\approx 10\%$ $NH_3$). The combined reagents then flowed over the hot substrate. Outflow from the reaction chamber exited to an oil bubbler, which prevented back flow of air into the reaction chamber. After each deposition the films were allowed to cool slowly in the reactor under a flow of helium.

The highest growth rates (up to 1000 Å/min) were obtained when the bubbler assembly containing the precursor and the reactor feed lines servicing the gallium complex were maintained at 100° C. and 130° C., respectively. All of the films showed good adhesion (Scotch tape test). The transmission electron microscopy showed that the film was polycrystalline with $\approx$5-15 nm crystallites.

Film compositions were determined by Rutherford backscattering spectrometry (RBS). The RBS analysis indicated that the films contained 53-54 at. % N and 46-47 at. % Ga, which yields N/Ga ratios in the range 1.12 to 1.17. These atomic compositions exclude any hydrogen, which cannot be detected in the RBS configuration. The films deposited on silicon wafers showed no oxygen or carbon RBS signals, indicating that these elements were present in low concentrations (less than 2-3 at. %). Based on XPS analyses of films deposited on silicon, the bulk of the films was estimated to contain <1 at. % carbon and <2 at. % oxygen.

EXAMPLE 8

The procedure of Example 7 was repeated, except that the ammonia gas reactant was omitted. No deposit was formed.

EXAMPLE 9

A conductive polycrystalline tin nitride thin film was prepared from tetrakis(dimethylamido)tin(IV) and excess ammonia.

In a typical experiment, the temperature of the precursor bubbler assembly was maintained at 90° C. while the delivery lines to the reactor were held at 125° C. Under these conditions, films up to 3000 Å thick were obtained at growth rates of 1000 Å/min for substrate temperatures between 200° C. and 400° C. Growth rates were increased by increasing the temperature of the bubbler assembly, but too much heating led to the formation of rough films, presumably because the concentration of $Sn(NMe_2)_4$ in the gas stream was too high. The highest growth rates were obtained on substrates placed near the inlet of the reactor.

Film compositions were determined by Rutherford backscattering spectrometry. No oxygen or carbon signals were detected, indicating that these elements were presented in low concentrations (<2-3 atom %). Films grown at higher temperatures also showed no oxygen or carbon contamination. The N/Sn ratio did not vary appreciably with temperature; for example, it was 1.50 for films deposited at 200° C. and 1.45 at 400° C. X-ray photoelectron analysis was used to estimate the carbon and oxygen levels in the films; preferential sputtering precluded the use of XPS for determining N/Sn ratios. After sputtering to a constant composition, no carbon or oxygen signals were observed which confirmed the RBS results that indicated these elements were present in low concentrations.

Hydrogen concentrations in the films were determined by forward recoil spectrometry (FRS). FRS spectra obtained for films deposited at 200°, 300° and 400° C. indicated that the films were hydrogenated, with the hydrogen concentration varying from 18 atom % at 200° C. to 15 atom % at 400° C. Based on this data a $Sn_2N_3H$ stoichiometry is calculated.

EXAMPLE 10

Aluminum nitride was prepared according to equation 3, $$Al_2(NMe_2)_6 + 2NH_3 \rightarrow 2AlN + 6HNMe_2. \qquad (3)$$

Depositions were carried out in an atmospheric pressure laminar flow rectangular glass reactor heated from below. Purified helium was used as a carrier gas for the aluminum-containing compound as well as for ammonia. During the depositions, helium was passed through a stainless steel bubbler containing the aluminum precursor, $Al_2(NMe_2)_6$, and this mixture then flowed through a 1 mm i.d. delivery line to the reaction chamber. Approximately 2 cm before this delivery line entered the reaction chamber, the $Al_2(NMe_2)_6$/He mixture was combined with ammonia gas diluted with helium ($\approx 10\%$ $NH_3$). In a typical reaction, the stainless steel bubbler was heated to 100° C., and the delivery line to the reaction chamber was maintained at 130° C. The combined reagents then flowed over the hot substrate. Outflow from the reaction chamber exited to an oil bubbler, which prevented back flow of air into the reaction chamber. After each deposition the films were allowed to cool slowly in the reactor under a flow of helium.

Deposition was carried out on silicon, vitreous carbon and glass substrates at substrate temperatures of 100°-400° C., or preferably 200°-250° C. The films showed good adhesion (Scotch tape test) and were chemically resistant except to concentrated hydrofluoric acid. Film growth rates were estimated at 1000 Å/min.

Film compositions were determined by RBS. The films contained 52-54 at. % Al and 46-48 at. % N, which yields N/Al ratios in the range of 1.1 to 1.2. XPS was used to estimate carbon and oxygen levels. The oxygen concentration was found to vary between 1 and 5 at. %, and no carbon was detected in any case.

EXAMPLE 11

The experiment was carried out as described in Example 10, except that no ammonia was used. No films were deposited at substrate temperatures of 200°-250° C.

Similar reactions occurred using analogous zirconium, hafnium, vanadium, niobium and tantalum dialkylamido derivatives. Similar reactions can occur using indium dialkylamido derivatives. Similar results can be obtained with bis(trialkylsilyl)amido derivatives of these metals.

What is claimed is:

1. A process for making a main group metal nitride coating comprising the steps of:
    forming a vaporous mixture of ammonia gas and a vapor of a main group metal amido compound, said main group metal selected from the group consisting of aluminum, gallium, tin and indium; and exposing said vaporous mixture to a substrate to deposit said main group metal nitride coating on said substrate.

2. The process of claim 1 wherein said main group metal amido compound includes a dialkylamido functional group.

3. The process of claim 2 wherein said dialkylamido functional group includes a dimethylamido functional group.

4. The process of claim 2 wherein said dialkylamido functional group includes a diethylamido functional group.

5. The process of claim 1 wherein said main group metal amido compound includes a cyclic amido functional group.

6. The process of claim 5 wherein said cyclic amido functional group is selected from the group consisting of piperidino and pyrrolidino groups.

7. The process of claim 1 wherein said ammonia gas and said metal main group metal amido compound are individually diluted with an inert carrier gas before they are combined in close proximity to said substrate.

8. The process of claim 7 wherein said inert carrier gas is a gas selected from the group consisting of helium, nitrogen, argon or neon.

9. The process of claim 1 wherein said substrate is heated in the range of 100° C. to 400° C.

10. The process of claim 1 wherein said substrate is heated in the range of 150° C. to 300° C.

11. The process of claim 1 wherein said substrate is heated in the range of 200° C. to 250° C.

12. The process of claim 1 wherein said substrate is silicon, vitreous carbon, glass, steel or polyester.

13. The process of claim 1 wherein said substrate is an organic polymer that does not melt or decompose under reaction conditions of the deposition.

14. The process of claim 1 wherein said amido compound is hexakis(dimethylamido)dialuminum.

15. The process of claim 1 wherein said amido compound is hexakis(dimethylamido)dialuminum.

16. The process of claim 1 wherein said amido compound is tetrakis(dimethylamido)tin(IV).

17. The process of claim 1 wherein said amido compound is tetrakis(diethylamido)tin(IV).

18. The process of claim 2 wherein at least one of said dialkylamido functional groups is replaced by an alkyl group such that at least one dialkylamido group remains.

19. The process of claim 1 wherein said main group metal amido compound is a bis(trialkylsily)amido compound.

* * * * *

UNITED STATES PATENT AND TRADEMARK OFFICE
CERTIFICATE OF CORRECTION

PATENT NO. : 5,178,911

DATED : January 12, 1993

INVENTOR(S) : Roy G. Gordon, David Hoffman and Umar Riaz

It is certified that error appears in the above-identified patent and that said Letters Patent is hereby corrected as shown below:

Column 8, line 13, delete "dialuminum" and insert therefor --digallium--.

Signed and Sealed this

Sixteenth Day of November, 1993

Attest:

BRUCE LEHMAN

*Attesting Officer*    *Commissioner of Patents and Trademarks*